United States Patent [19]
Wang et al.

[11] Patent Number: 6,091,653
[45] Date of Patent: Jul. 18, 2000

[54] METHOD OF SENSING DATA IN SEMICONDUCTOR MEMORY DEVICE

[75] Inventors: Shiou-Yu Alex Wang, Fremont, Calif.; Ping Chao Ho, Taipei; Mingshiang Wang, Taichung, both of Taiwan

[73] Assignee: Nanya Technology Corporation, Taiwan

[21] Appl. No.: 09/375,448

[22] Filed: Aug. 17, 1999

[30] Foreign Application Priority Data

May 18, 1999 [TW] Taiwan .................................. 88108063

[51] Int. Cl.$^7$ ...................................................... G11C 7/00
[52] U.S. Cl. ................................................................. 365/203
[58] Field of Search .................................... 365/203, 205, 365/207, 208, 194, 226, 190

[56] References Cited

U.S. PATENT DOCUMENTS

| | | | |
|---|---|---|---|
| 4,908,797 | 3/1990 | McElroy | 365/207 |
| 5,365,488 | 11/1994 | Matsushita | 365/226 |
| 5,402,378 | 3/1995 | Min et al. | 365/203 |
| 5,444,662 | 8/1995 | Tanaka et al. | 365/203 |
| 5,872,737 | 2/1999 | Tsuruda et al. | 365/226 |
| 5,959,913 | 9/1999 | Raad | 365/190 |
| 5,970,007 | 10/1999 | Shiratake | 365/207 |

*Primary Examiner*—Trong Q. Phan
*Attorney, Agent, or Firm*—George T. Marcou; Kilpatrick Stockton LLP

[57] ABSTRACT

The present invention provides a method of sensing data in a semiconductor device. First, an equalizing instructing signal is provided to stop precharging and equalizing the bit line pair while in a reading state. Then a wordline is selected to transmit the data in a memory cell to one of the pair of bit lines for obtaining a potential difference between the bit line pair. A sensing enable signal is subsequently provided to activate the shared sense amplifier for sensing and amplifying the data. And a potential level of the selecting control signal is boosted to a boosted potential level to restore and read the data by delaying a predetermined period of time.

14 Claims, 3 Drawing Sheets

METHOD OF SENSING DATA IN SEMICONDUCTOR MEMORY DEVICE

BACKGROUND OF THE INVENTION

1. Field of the Invention

The present invention relates to an apparatus of data sensing in semiconductor memory, and more particularly to a method of high speed sensing and circuit restoring in DRAM design.

2. Description of the Relative Art

As shown in FIG. 1A, the conventional DRAM array is mainly comprised of a memory cell MC, which commonly includes a selection transistor T and a storage capacitor C, wherein the gate of the selection transistor T is controlled by a wordline WL. When the wordline WL is selected and results in the ON condition of the selection transistor, charges stored in the storage capacitor C are sent to the bit line BL and sensing amplifier SA. After the comparison of the sensing amplifier SA, the logic output of the memory cell MC is determined and sent to the I/O data line to be read.

As mentioned above, the storage capacitor C discharges during the read of the memory cell MC; thus, the data isn't stored in the memory cell. Therefore, it is necessary for the sensing amplifier SA to restore the charges in the memory cell MC before completing the data reading.

Furthermore, as a semiconductor memory device is highly integrated to reduce the size of the memory cell, there is inevitably a tendency of reduction in parasitic capacitance Cb of the memory capacitor. Various improvements have been made to obtain sufficient difference in input potentials for a sense amplifier SA.

In the U.S. Pat. No. 4,351,034, a shared sense amplifier is disclosed, wherein a memory cell array is divided into two blocks and the sense amplifier is disposed and shared between the two blocks. During the sensing operation, only the columns in one block are connected to the sense amplifier. The columns of the other block are subsequently connected to the sense amplifier after the sensing operation.

With the above-described arrangement, since the number of memory cells connected to one bit line can be reduced, parasitic capacitance of the bit line associated with the memory cells can be reduced. That is, the potential on the bit line varies in proportion to a ratio Cs/Cb of the memory cell capacitance Cs to the bit line capacitance. So that even if the same amount of signal charges are transferred onto the bit line, potential changes on the bit line can be almost twice that in a non-divided cell array.

However, in this construction, the bit line still causes time delays during the sensing of the data in the memory cell because of the large numbers of memory cells, and results in the slow access time of the DRAM cell.

SUMMARY OF THE INVENTION

Accordingly, the primary object of the present invention is to isolate the parasitic capacitors in a bit line effectively so that the sensing amplifier is more sensitive, and increase the sensing speed based on the weak connection of the bit line and the sensing amplifier.

In order to achieve the above object, the present invention provides a method of sensing data in a semiconductor device. First, an equalizing instructing signal is provided to stop precharging and equalizing the bit line pair while in reading state. Then a wordline is selected to transmit the data in a memory cell to one of the pair of bit lines for obtaining a potential difference between the bit line pair. A sensing enable signal is subsequently provided to activate the shared sense amplifier for sensing and amplifying the data.

A potential level of the selecting control signal is boosted by delaying a predetermined period of time to a boosted level to restore and read the data.

BRIEF DESCRIPTION OF THE DRAWINGS

These and other features of the present invention will now be described in detail with reference to the accompany drawings, in which.

DETAILED DESCRIPTION

Figure 1A:
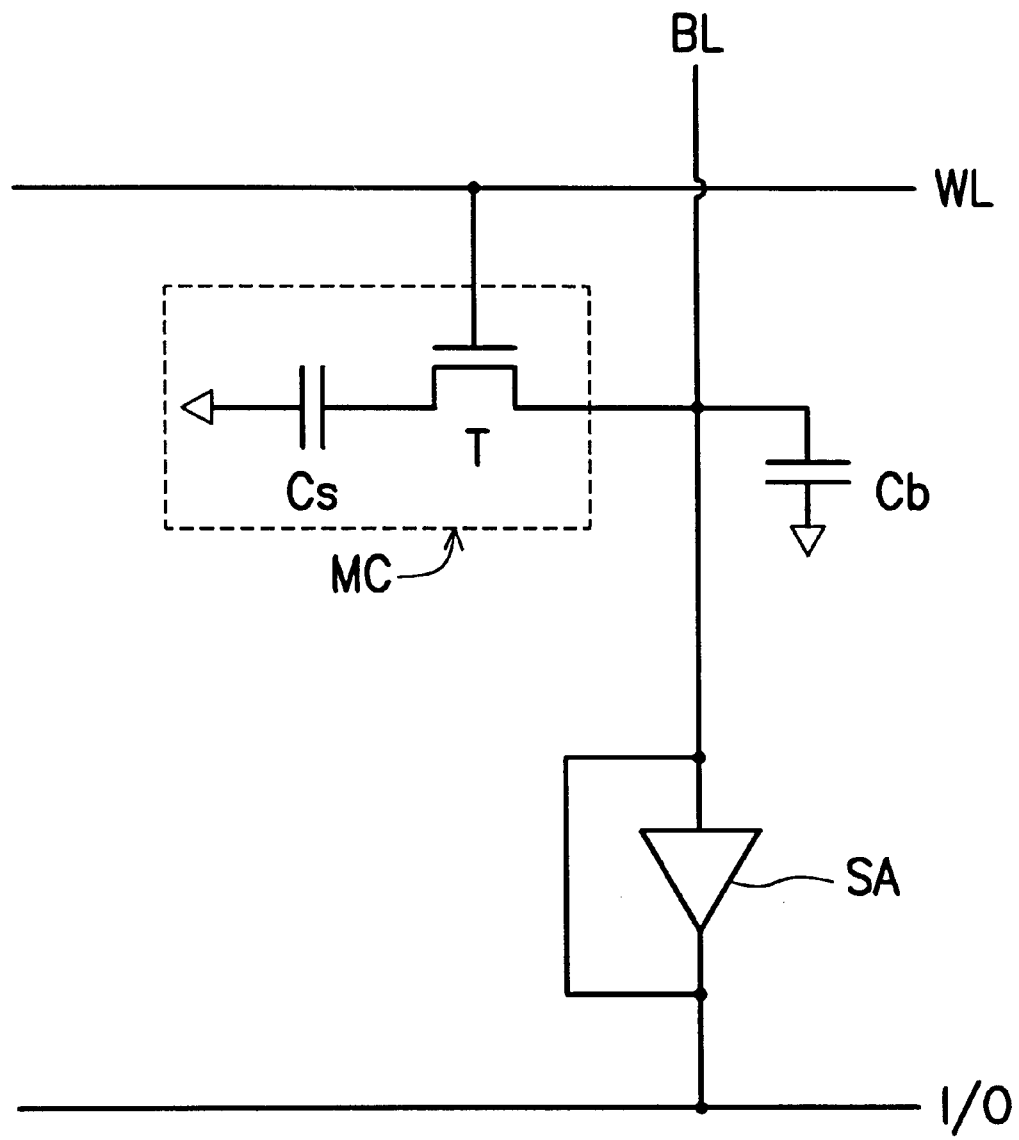
FIG. 1A shows parts of the composition of a conventional DRAM array cell.
Figure 1B:
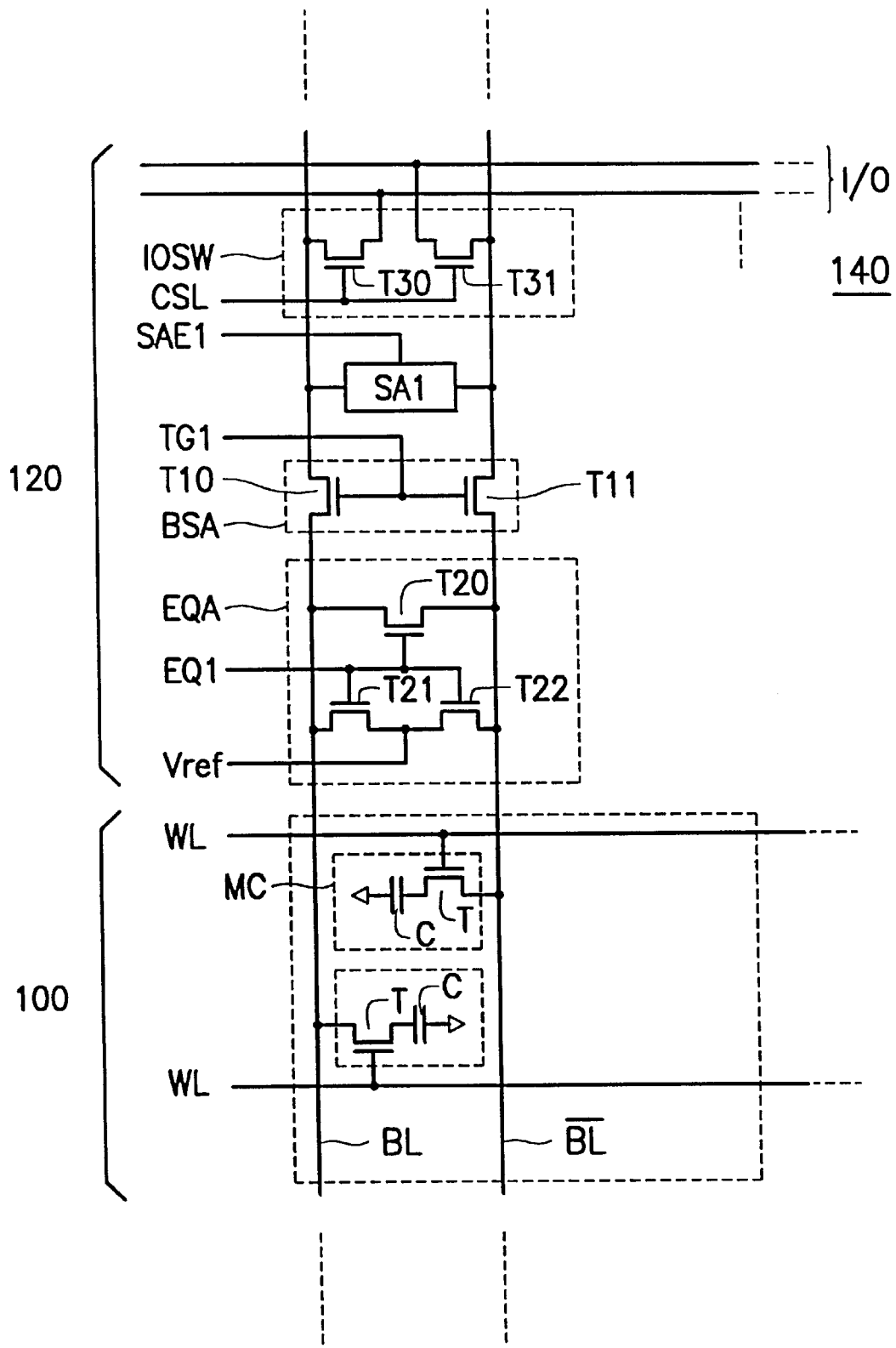
FIG. 1B shows parts of the composition of the conventional DRAM array cell including the sensing amplifier circuit and memory cell blocks.

A traditional memory array, in which the bit line pair BL/$\overline{BL}$ of memory cell block 100 and relative sensing amplifier circuit 120 are placed, is shown in FIG. 1B. The memory cell MC is disposed between one wordline WL and a pair of bit lines BL/$\overline{BL}$. The selection transistor T is responsive to a signal potential on the wordline WL for connecting the storage capacitor C to the bit line BL(or $\overline{BL}$).

In order to differentially sense and amplify a signal potential on a bit line pair BL/$\overline{BL}$, a shared sense amplifier SA1 is provided to the bit line pair BL/$\overline{BL}$ in the embodiment. The sense amplifier is often a differential amplifier, and the sensing enable signal SAE1 is used to activate the sensing amplifier SA1 to do the sensing operation. Equalizing circuit EQA is provided for precharging and equalizing each bit line pair BL/$\overline{BL}$ to a reference voltage Vref while the semiconductor memory device is in the standby state. Moreover, the equalizing circuit EQA includes a transistor 20, for example, a n-channel transistor, which responds to an equalization instructing signal EQ1 to electrically short-circuit the bit line pair BL/$\overline{BL}$, and transistors 21 and 22 (herein takes n-channel transistors are also taken as an example), which also respond to the equalization instructing signal EQ1 to transmit the reference voltage Vref to the bit line pair BL/$\overline{BL}$.

Bit line selecting switches BSA selectively connect the bit line pair BL/$\overline{BL}$ to the shared sense amplifier SA1. In other words, the bit line selecting switches BSA selectively connect the bit line pair BL/$\overline{BL}$ of the memory block 100 to the shared sense amplifier SA1 in response to a selection control signal TG1. The bit line selecting switches BSA includes transfer gates T10 and T11 for conducting the bit line pair BL/$\overline{BL}$ to the shared sense amplifier SA1 in response to the selection control signal TG1.

I/O (input/output) switch IOSW, including transfer gates T30 and T31 which turn on in response to column selecting signal CSL, is used to connect the bit line pair BL/$\overline{BL}$ to I/O data bus 140 in response to the column selecting signal CSL.

Figure 2:
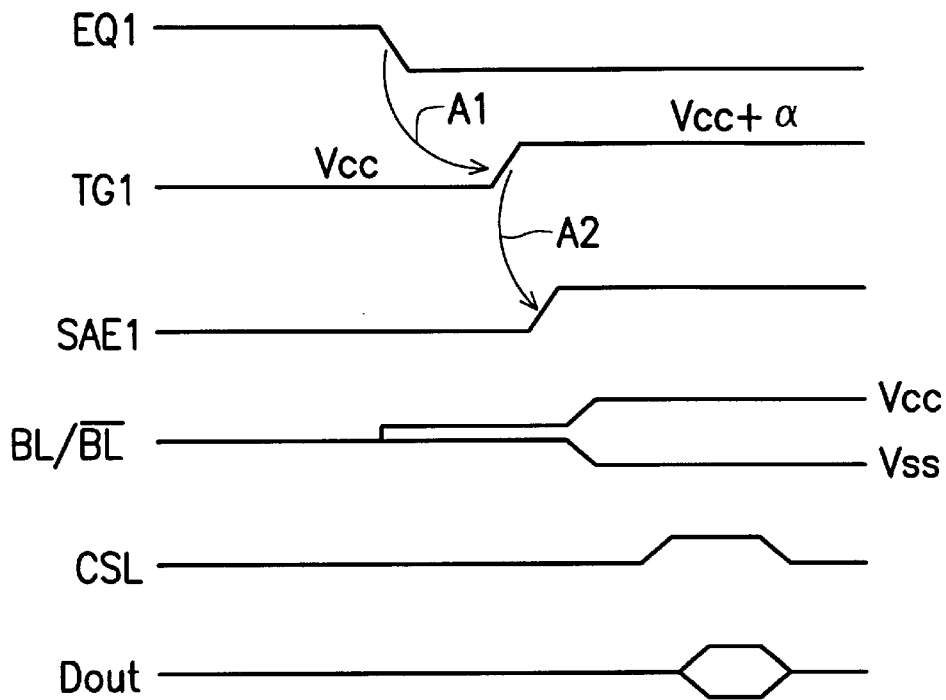
FIG. 2 shows the waveform of the conventional semiconductor memory device during the reading operation.

Taking the traditional reading operation as an example, as shown in FIG. 2, the semiconductor memory device is initially in a standby state, and the equalizing circuit EQA precharges and equalizes the bit line pair BL/$\overline{BL}$, as shown in FIG. 1B, to a reference voltage Vref. For example, set the potential of the bit line pair BL/$\overline{BL}$ is set to the power supply potential Vcc or ½Vcc. Then, the potential of the selection control signal TG1 is boosted to a voltage level Vcc of logic 1. The bit line selecting switches BSA are thereby in ON state, and selectively connect the bit line pair BL/$\overline{BL}$ of the memory block 100 to the shared sense amplifier SA1 in response to the selecting control signal TG1.

Next, the equalizing circuit EQA ceases to precharge and equalize the bit line pair BL/$\overline{BL}$ when the potential of the equalization instructing signal EQ1 decreases to the low level potential of the logic 0. As a wordline WL of the memory cell block is chosen, the transistor of the memory cell MC turns on and the signal potential stored in the capacitor transmits to one of the pair of bit lines BL/$\overline{BL}$ (like BL) by the boosted potential of the wordline. The operations described above result in the potential difference between the bit line pair BL/$\overline{BL}$.

Then, as shown in path A1, the selecting control signal TG1 is at a boosted potential level Vcc+α higher than the power supply voltage Vcc.

Thereafter, as shown in path A2, when the sensing enable signal SAE1 is boosted up to a high level potential of logic 1, the sense amplifier SA1 is activated to perform the sensing operation to sense the data which is amplified and restored. Wherein the bit line at low potential will discharge to ground voltage Vss, and the bit line at high potential will charge to the power supply voltage Vcc.

The potential of the column selecting signal CSL is subsequently boosted into the high voltage of logic 1, and the I/O switch IOSW connects the bit line pair BL/$\overline{BL}$ to the I/O data bus 140 in response to the column selecting signal CSL. When the semiconductor memory device is in the reading mode, data in the I/O data bus 140 is then transmitted into the output buffer (not shown) to be the output data Dout of the output terminal. However, the above still has a problem because the sensing amplifier SA1 operates in response to the sensing enable signal SAE1, the selection control signal TG1, which the bit line selecting switch BSA connecting the sensing amplifier SA1 and the memory cell block 100 responds to, is at a potential higher than the power supply voltage Vcc+α. Therefore, the on-resistance of the bit line selecting switch BSA and the connection resistance between the bit line and the sensing amplifier are relatively low. Thus, the parasitic capacitance Cb can't be effectively lowered, and the sensing amplifier is not sufficiently sensitive. That is, the strong connection between the bit line and the sensing amplifier slows down the sensing velocity.

Figure 3:
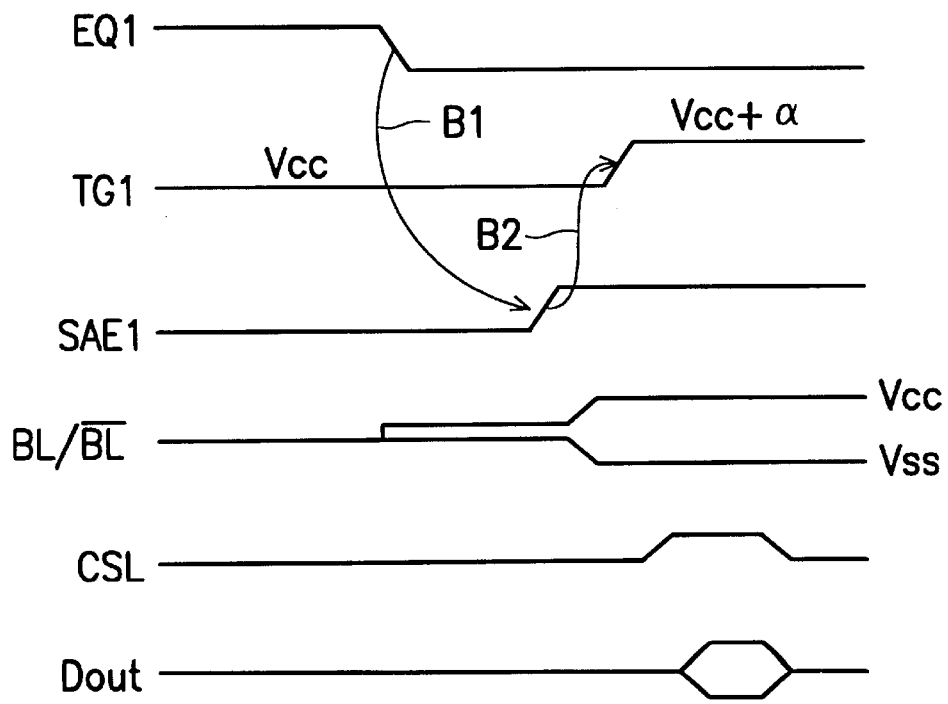
FIG. 3 shows the waveform of the semiconductor memory during the reading operation in the embodiment of the present invention.

Accordingly, an embodiment is provided in the present invention to address the phenomenon described above. Taking a reading operation for example (as shown in FIG. 3) the semiconductor memory device is initially in a standby state, and the equalizing circuit EQA precharges and equalizes the bit line pair BL/$\overline{BL}$ (as shown in FIG. 1B) to a reference voltage Vref. For example, set the potential of the bit line pair BL/$\overline{BL}$ in power supply potential Vcc or ½Vcc. Then, the potential of the selection control signal TG1 is boosted to a voltage level Vcc of logic 1. The bit line selecting switches BSA are thereby in ON state, and selectively connect the bit line pair BL/$\overline{BL}$ of the memory block 100 to the shared sense amplifier SA1 in response to the selecting control signal TG1.

Next, the equalizing circuit EQA ceases to precharge and equalize the bit line pair BL/$\overline{BL}$ when the potential of the equalization instructing signal EQ1 decreases to the low level potential of the logic 0. As a wordline WL of the memory cell block is chosen, the transistor of the memory cell MC turns on and the data (signal potential) stored in the capacitor transmits to one of the pair of bit lines BL/$\overline{BL}$ (like BL) by the boosted potential of the wordline. The operations described above result in the potential difference between the bit line pair BL/$\overline{BL}$.

Then, as shown in path B1, the sensing enable signal SAE1 is boosted up to a high level potential of logic 1, the sense amplifier SA1 is activated to perform the sensing operation to sense the data which is amplified, wherein the bit line at low potential will discharge to ground voltage Vss, and the bit line at high potential will charge to the power supply voltage Vcc.

As shown in path B2, the selection control signal TG1 is delayed for a predetermined period; thus, the potential is boosted to a potential level Vcc+α, which is higher than the power supply voltage Vcc, to restore the data after the sensing enable signal SAE1 up to a high level potential of logic 1. The power supply voltage Vcc is transmitted to the bit line (like BL) through the selection switch BSA according to the sensing amplifier and restores data in the memory cell that is chosen.

Similar to the traditional reading operation, the potential of the column selecting signal CSL is subsequently boosted into the high voltage of logic 1, and the I/O switch IOSW connects the bit line pair BL/$\overline{BL}$ to the I/O data bus 140 in response to the column selecting signal CSL. When the semiconductor memory device is in the reading mode, data in the I/O data bus 140 is then transmitted into the output buffer (not shown) to be the output data Dout of the output terminal. The embodiment is an improvement in that the sensing amplifier SA1 operates in response to the sensing enable signal SAE1, the selection control signal TG1, which the bit line selecting switch BSA connecting the sensing amplifier SA1 and the memory cell block 100 responds to, is at a potential of the power supply voltage Vcc lower than the voltage Vcc+α. Thus, the on-resistance of the bit line selecting switch BSA and the connection resistance between the bit line and the sensing amplifier temporarily increase. The parasitic capacitance Cb can be effectively lowered, and the sensing amplifier is more sensitive. That is, the weak connection between the bit line and the sensing amplifier increases the sensing velocity.

While the present invention has described and illustrated herein with reference to the preferred embodiment thereof, it will be understood by those skilled in the art that various changes in the form and details may be made therein without departing from the spirit and the scope of the invention.

What is claimed is:

1. A method of sensing data during a reading operation in a semiconductor memory device including at least a shared sense amplifier and a memory block composed of a bit line pair, a wordline, and a memory cell, which provides an equalizing instructing signal, a sensing enable signal, and a selecting control signal, comprising the steps of:

(a) varying the equalizing instructing signal to stop precharging and equalizing the bit line pair;
 (b) selecting the wordline to transmit the data in the memory cell of the memory block to one of the pair of bit lines for obtaining a potential difference between the bit line pair;
 (c) varying the sensing enable signal to activate the shared sense amplifier for sensing and amplifying the data; and
 (d) after the variation of the sensing enable signal, varying the potential level of the selecting control signal by delaying a predetermined period of time to a boosted potential level to restore the data.

2. The method of sensing data as claimed in claim 1, wherein the semiconductor memory device is a dynamic random access memory device.

3. The method of sensing data as claimed in claim 1, wherein the bit line pair includes a bit line at low potential and a bit line at high potential to produce a potential difference in step (b).

4. The method of sensing data as claimed in claim 3, wherein the bit line at low potential is discharged to ground voltage, and the bit line at high potential is charged to the power supply voltage by the shared sense amplifier to sense amplify the data.

5. A method of sensing data in a semiconductor memory device which includes at least a memory block composed of a bit line pair, a wordline, and a memory cell, a shared sense amplifier, an equalizing circuit, and a bit line selecting switch, comprising the steps of:

providing an equalizing instructing signal to activate the equalizing circuit to precharge and equalize the bit line pair to a reference voltage while in a standby state;

providing a selecting control signal to activate the bit line selecting switch for connecting the bit line pair to the shared sense amplifier selectively;

providing a sensing enable signal that will activate the sensing amplifier;

varying the equalizing instructing signal so that it does not activate the equalizing circuit and precharge and equalize the bit line pair while in a reading state;

selecting the wordline to transmit the data in the memory cell to one of the pair of bit lines for obtaining a potential difference between the bit line pair;

varying the sensing enable signal to activate the sensing amplifier for sensing and amplifying the data; and after the variation of the sensing enable signal, delaying a predetermined period of time, and varying the potential level of the selecting control signal to a boosted potential level to restore the data.

6. The method of sensing data as claimed in claim 5, wherein the semiconductor memory device is a dynamic random access memory device.

7. The method of sensing data as claimed in claim 5, wherein the bit line pair includes a bit line at low potential and a bit line at high potential to produce a potential difference.

8. The method of sensing data as claimed in claim 7, wherein the bit line at low potential is discharged to ground voltage, and the bit line at high potential is charged to the power supply voltage by the shared sense amplifier to sense and amplify the data.

9. The method of sensing data as claimed in claim 5, wherein an equalizing instructing signal of high level logic is provided to the equalizing circuit to precharge or equalize the bit line pair to a reference voltage while in standby state.

10. The method of sensing data as claimed in claim 9, wherein the equalizing instructing signal is varied to a low level logic so that an equalizing circuit doesn't precharge and equalize the bit line pair while in reading state.

11. The method of sensing data as claimed in claim 5, wherein a sensing enable signal of low level logic is provided that does not activate the sensing amplifier.

12. The method of sensing data as claimed in claim 11, wherein a sensing enable signal is varied to high level logic to activate the sensing amplifier to sense and amplify the data.

13. The method of sensing data as claimed in claim 5, wherein a selection control signal of the power supply voltage is provided so that the bit line selecting switch connects the bit line pair to the shared sense amplifier while in a standby state.

14. The method of sensing data as claimed in claim 13, wherein the selecting control signal is varied to a potential higher than the boosted potential level of the power supply voltage by delaying a predetermined period of time to restore and read the data.

* * * * *